United States Patent
Nozawa et al.

(10) Patent No.: US 8,969,210 B2
(45) Date of Patent: Mar. 3, 2015

(54) PLASMA ETCHING APPARATUS, PLASMA ETCHING METHOD, AND SEMICONDUCTOR DEVICE MANUFACTURING METHOD

(75) Inventors: Toshihisa Nozawa, Miyagi (JP); Masaru Sasaki, Miyagi (JP); Jun Hashimoto, Albany, NY (US); Shota Yoshimura, Miyagi (JP); Toshihisa Ozu, Miyagi (JP); Tetsuya Nishizuka, Beaverton, OR (US)

(73) Assignee: Tokyo Electron Limited, Tokyo (JP)

( * ) Notice: Subject to any disclaimer, the term of this patent is extended or adjusted under 35 U.S.C. 154(b) by 487 days.

(21) Appl. No.: 13/232,160

(22) Filed: Sep. 14, 2011

(65) Prior Publication Data

US 2012/0064726 A1 Mar. 15, 2012

(30) Foreign Application Priority Data

Sep. 15, 2010 (JP) ................... 2010-206536

(51) Int. Cl.
| | |
|---|---|
| H01L 21/3065 | (2006.01) |
| H01J 37/32 | (2006.01) |
| H01L 21/311 | (2006.01) |
| H01L 21/762 | (2006.01) |
| H01L 21/768 | (2006.01) |
| H01L 29/66 | (2006.01) |

(52) U.S. Cl.
CPC ....... *H01L 21/3065* (2013.01); *H01J 37/32192* (2013.01); *H01J 37/32706* (2013.01); *H01L 21/31116* (2013.01); *H01L 21/76224* (2013.01); *H01L 21/76897* (2013.01); *H01L 29/6653* (2013.01); *H01L 29/6656* (2013.01)
USPC ...................... 438/710; 216/67; 257/E21.218

(58) Field of Classification Search
None
See application file for complete search history.

(56) References Cited

U.S. PATENT DOCUMENTS

| | | | | |
|---|---|---|---|---|
| 4,808,258 | A * | 2/1989 | Otsubo et al. | 438/710 |
| 5,352,324 | A * | 10/1994 | Gotoh et al. | 438/714 |
| 6,187,685 | B1 * | 2/2001 | Hopkins et al. | 438/710 |
| 6,660,647 | B1 * | 12/2003 | Ono et al. | 438/714 |
| 6,767,838 | B1 * | 7/2004 | Ono et al. | 438/720 |
| 2003/0132198 | A1 * | 7/2003 | Ono et al. | 216/69 |
| 2004/0058541 | A1 * | 3/2004 | Ono et al. | 438/689 |

(Continued)

FOREIGN PATENT DOCUMENTS

| | | |
|---|---|---|
| JP | 2008-053516 A | 3/2008 |
| JP | 2010-118549 A | 5/2010 |

(Continued)

*Primary Examiner* — Allan Olsen
(74) *Attorney, Agent, or Firm* — Pearne & Gordon LLP

(57) ABSTRACT

There is provided a plasma etching apparatus provided for performing an etching in a desirable shape. The plasma etching apparatus includes a processing chamber 12 for performing a plasma process on a target substrate W; a gas supply unit 13 for supplying a plasma processing gas into the processing chamber 12; a supporting table positioned within the processing chamber 12 and configured to support the target substrate thereon; a microwave generator 15 for generating a microwave for plasma excitation; a plasma generation unit for generating plasma within the processing chamber 12 by using the generated microwave; a pressure control unit for controlling a pressure within the processing chamber 12; a bias power supply unit for supplying AC bias power to the supporting table 14; and a control unit for controlling the AC bias power by alternately repeating supply and stop of the AC bias power.

6 Claims, 15 Drawing Sheets

(56) References Cited

U.S. PATENT DOCUMENTS

| | | |
|---|---|---|
| 2005/0048789 A1* | 3/2005 | Merry et al. .................. 438/723 |
| 2005/0136604 A1* | 6/2005 | Al-Bayati et al. ............ 438/301 |
| 2006/0144518 A1* | 7/2006 | Kaji et al. ................ 156/345.43 |
| 2008/0044960 A1* | 2/2008 | Al-Bayati et al. ............ 438/156 |
| 2011/0143537 A1* | 6/2011 | Lee et al. ...................... 438/669 |
| 2012/0208369 A1* | 8/2012 | Nishizuka .................... 438/714 |
| 2013/0084708 A1* | 4/2013 | Jain et al. ..................... 438/719 |
| 2013/0344702 A1* | 12/2013 | Nishizuka .................... 438/724 |

FOREIGN PATENT DOCUMENTS

| | | |
|---|---|---|
| JP | 2010118549 A * | 5/2010 |
| KR | 10-2000-0023026 A | 4/2000 |
| KR | 10-0276736 B1 | 3/2001 |
| KR | 10-2007-0086761 A | 8/2007 |
| WO | 2010/055862 A1 | 5/2010 |

* cited by examiner

PLASMA ETCHING APPARATUS, PLASMA ETCHING METHOD, AND SEMICONDUCTOR DEVICE MANUFACTURING METHOD

CROSS-REFERENCE TO RELATED APPLICATION

This application claims the benefit of Japanese Patent Application No. 2010-206536 filed on Sep. 15, 2010, the entire disclosures of which are incorporated herein by reference.

FIELD OF THE INVENTION

The present disclosure relates to a plasma etching apparatus, a plasma etching method, and a semiconductor device manufacturing method. In particular, the present disclosure relates to a plasma etching apparatus that performs an etching process on a target substrate, a plasma etching method using the plasma etching apparatus, and a method for manufacturing a semiconductor device by performing the etching process on the target substrate.

BACKGROUND OF THE INVENTION

A semiconductor device such as a LSI (Large Scale Integrated circuit) or a MOS (Metal Oxide Semiconductor) transistor is manufactured by performing a process such as etching, CVD (Chemical Vapor Deposition) or sputtering on a semiconductor substrate (wafer) serving as a target substrate. In etching, CVD or sputtering process, there has been performed a processing method using plasma as an energy supply source, i.e. plasma etching, plasma CVD, plasma sputtering.

An etching method in which bottoms of a groove and a hole are formed to reach an etching stopper film substantially at the same time during the etching is described in Japanese Patent Laid-open Publication No. 2008-53516.

Patent Document 1: Japanese Patent Laid-open Publication No. 2008-53516

There will be simply explained an example of performing an etching on a target substrate by using an apparatus described in Patent Document 1. Above all, on a silicon substrate serving as a target substrate, for example, a resist mask is formed. Then, a mask layer as a hard mask having a rectangular cross sectional shape is formed. Subsequently, the target substrate on which the mask layer is formed is supported on a supporting table within a plasma etching apparatus. Thereafter, a gas for plasma processing is supplied into a processing chamber under a certain pressure environment and an etching process is performed with plasma generated by a microwave or the like. Thus, it is possible to obtain a required shape in which, for example, a region on which the mask layer is not formed becomes a shallow groove to be an insulating layer later.

In this example, with regard to performing the etching process on the target substrate, there is a possibility that the following problems may occur. It is desirable that a rectangular cross sectional shape of the mask layer may remain as it is during the etching process. To be specific, it is preferable that corners and a flat portion between the corners constituting the rectangular shape be etched downwards in the same rate during the etching process. However, by way of example, if an etching process is performed by using an etching gas with high anisotropy, only corners of the mask layer are actively etched. In this case, in a groove-shaped region to be formed between mask layers, groove's side walls formed by etching may be tapered, i.e. slanted. Such a shape is not desirable.

The present disclosure provides a plasma etching apparatus capable of accurately performing an etching process in a desirable shape with more accuracy.

Further, the present disclosure provides a plasma etching method capable of performing an etching process in a desirable shape with more accuracy.

Furthermore, the present disclosure provides a semiconductor device manufacturing method capable of performing an etching process in a desirable shape with more accuracy.

BRIEF SUMMARY OF THE INVENTION

In accordance with one aspect of the present disclosure, there is provided a plasma etching apparatus configured to perform an etching process on a target substrate by plasma. The plasma etching apparatus may include a processing chamber configured to perform therein a plasma process on the target substrate; a gas supply unit configured to supply a plasma processing gas into the processing chamber; a supporting table positioned within the processing chamber and configured to support the target substrate thereon; a microwave generator configured to generate a microwave for plasma excitation; a plasma generation unit configured to generate plasma within the processing chamber by using the microwave generated by the microwave generator; a pressure control unit configured to control a pressure within the processing chamber; a bias power supply unit configured to supply AC bias power to the supporting table; and a control unit configured to control the AC bias power from the bias power supply unit by alternately repeating supply and stop of the AC bias power.

In accordance with another aspect of the present disclosure, there is provided a plasma etching method for performing an etching process on a target substrate with generated plasma by using a plasma etching apparatus. The plasma etching apparatus may include a processing chamber configured to perform therein a plasma process on the target substrate; a gas supply unit configured to supply a plasma processing gas into the processing chamber; a supporting table positioned within the processing chamber and configured to support the target substrate thereon; a microwave generator configured to generate a microwave for plasma excitation; a plasma generation unit configured to generate plasma within the processing chamber by using the microwave generated by the microwave generator; and a pressure control unit configured to control a pressure within the processing chamber. The plasma etching method may include controlling an AC bias power by alternately repeating supply and stop of the AC bias power, and performing an etching process on the target substrate by supplying the AC bias power to the supporting table.

In accordance with still another aspect of the present disclosure, there is provided a method for manufacturing a semiconductor device by performing an etching process by using a silicon nitride mask formed on a silicon substrate supported on a supporting table. The semiconductor device manufacturing method may include supplying a plasma processing gas with a ratio of a gas containing oxygen atoms to the whole plasma processing gas in a range of from about 0.05% to about 5% when etching the silicon substrate; and controlling an AC bias power supplied to the supporting table by adjusting a duty ratio (a/b) of a supply time (a) of the AC bias power from a bias power supply unit to a total time (b) including the supply time (a) and a stop time of the AC bias power to be higher than about 0.5 and lower than about 1.0.

In accordance with still another aspect of the present disclosure, there is provided a plasma etching method for performing a plasma etching process on a target substrate supported on a supporting table. The plasma etching method may include generating plasma by supplying into a processing chamber an etching gas and a gas capable of oxidizing and modifying a reaction by-product with radicals; etching the target substrate; oxidizing and modifying a deposited reaction by-product with radicals; and controlling a deposit amount of the reaction by-product by adjusting a duty ratio (a/b) of a supply time (a) of an AC bias power to a total time (b) of the AC bias power and by adjusting an ON/OFF frequency of the bias power. The AC bias power may be supplied to the supporting table for supporting the target substrate, and the total time (b) includes the supply time (a) and a stop time of the AC bias power.

In accordance with the above-described plasma etching apparatus, plasma etching method and semiconductor device manufacturing method, it is possible to perform an etching process in a desirable shape with more accuracy.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
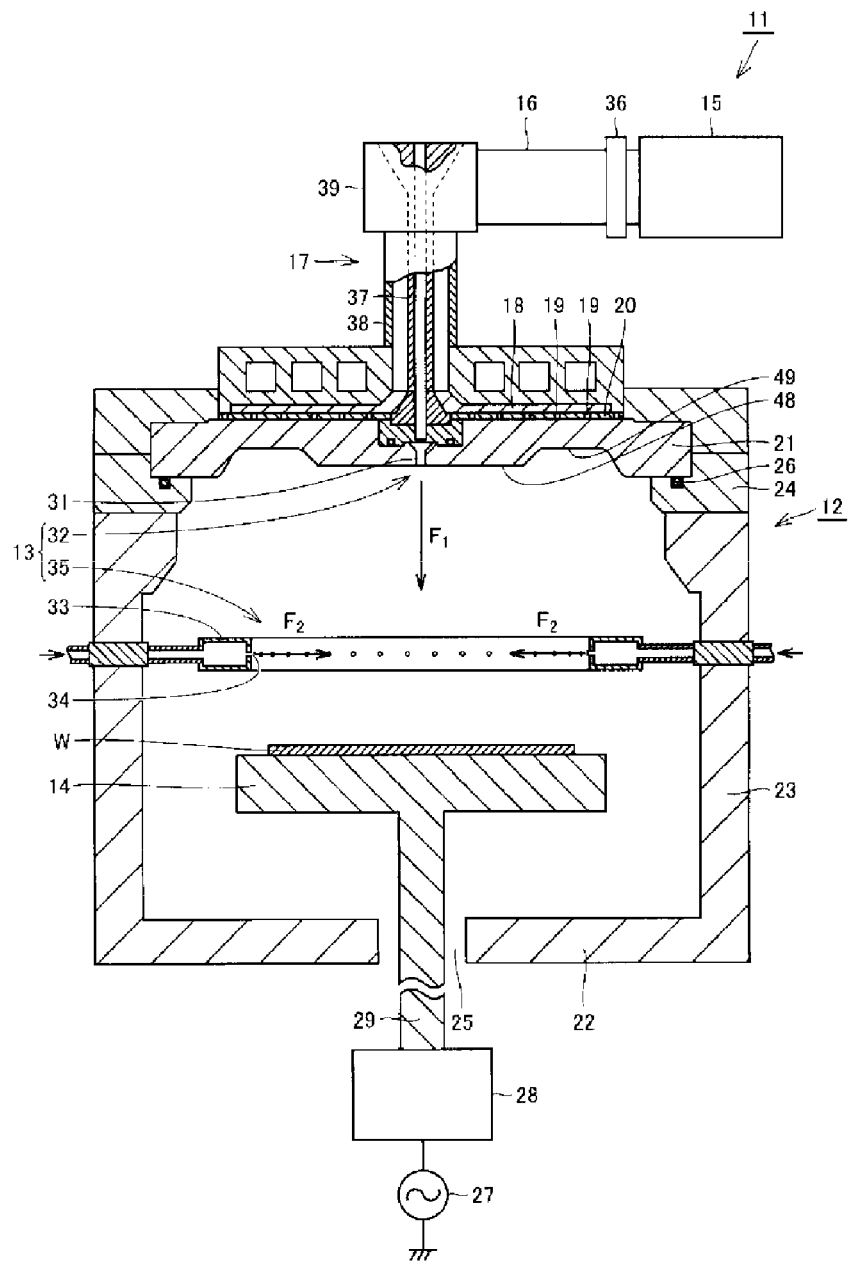
FIG. 1 is a schematic cross sectional view schematically showing a configuration of a plasma etching apparatus in accordance with an embodiment of the present disclosure.
Figure 2:
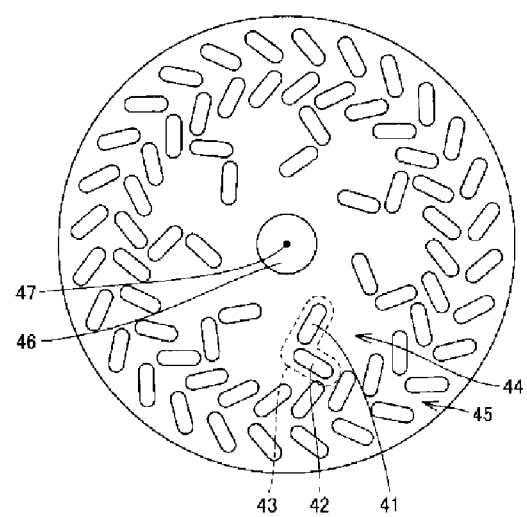
FIG. 2 shows a slot antenna plate, when viewed from its thickness direction, provided in a plasma etching apparatus in accordance with the embodiment of the present disclosure.

Hereinafter, embodiments of the present disclosure will be described in detail with reference to the accompanying drawings. Above all, there will be explained a configuration of a plasma etching apparatus in accordance with an embodiment of the present disclosure. FIG. 1 is a schematic cross sectional view schematically showing a configuration of a plasma etching apparatus in accordance with an embodiment of the present disclosure. FIG. 2 shows a slot antenna plate, when viewed from its thickness direction, provided in the plasma etching apparatus depicted in FIG. 1.

Referring to FIGS. 1 and 2, a plasma etching apparatus 11 may use a microwave as a plasma source. The plasma etching apparatus 11 may include a processing chamber 12 having a processing space in which a plasma process may be performed on a target substrate W; a gas supply unit 13 configured to supply a gas for a plasma process into the processing chamber 12; a supporting table 14 provided within the processing chamber 12 and configured to support the target substrate W thereon; a microwave generator 15 provided outside the processing chamber 12 and configured to generate a microwave for plasma excitation; a waveguide 16 and a coaxial waveguide 17 configured to introduce the microwave generated by the microwave generator 15 into the processing chamber 12; a dielectric plate 18 connected with a lower end of the coaxial waveguide 17 and configured to propagate the microwave introduced by the coaxial waveguide 17 in a diametrical direction; a slot antenna plate 20 positioned on a lower side of the dielectric plate 18 and having multiple slots (long holes) 19 for radiating the microwave propagated by the dielectric plate 18; a dielectric window 21 positioned on a lower side of the slot antenna plate 20 and configured to propagate the microwave radiated from the slots 19 in a diametrical direction and transmit the microwave into the processing chamber 12; and a control unit (not illustrated) configured to control the plasma etching apparatus 11. The control unit may control processing conditions, such as a gas flow rate in the gas supply unit 13, a temperature within the processing chamber 12, or the like, for performing a plasma process on the target substrate W. Further, the control unit may control a bias power supply unit, which will be described later, to alternately and repeatedly supply and stop AC bias power during etching. The plasma etching apparatus 11 may include a TMP (Turbo Molecular Pump) (not illustrated) configured to depressurize the inside of the processing chamber 12, and the control unit may adjust a pressure within the processing chamber 12 to be a certain pressure level (including a vacuum level) by controlling an operation of the TMP. For the convenience of understanding, FIG. 1 schematically shows a shape of openings of the slots 19.

The processing chamber 12 may include a bottom portion 22 positioned on a lower side of the supporting table 14; a side wall 23 upwardly extended along a periphery of the bottom portion 22; and an annular member 24 positioned on an upper side of the side wall 23 and configured to mount the dielectric window 21 thereon. The side wall 23 may be formed in a cylindrical shape. In the bottom portion 22 of the processing chamber 12, an exhaust hole 25 may be formed. An upper side of the processing chamber 12 may be opened and the processing chamber 12 may be sealed airtightly by an O-ring 26 as a sealing member positioned between the dielectric window 21 provided on an upper side of the processing chamber 12 and the processing chamber 12, to be specific, the annular member 24 constituting the processing chamber 12.

A high frequency power supply 27 for a RF (Radio Frequency) bias may be electrically connected with an electrode of the supporting table 14 via a matching unit 28. The high frequency power supply 27 serving as a bias power supply unit may output a high frequency of a certain level, for example, about 13.56 MHz, appropriate for controlling energy of ions attracted into the target substrate W with a certain power, and may supply the high frequency to the supporting table 14. The matching unit 28 may include a matching device configured to match impedance between on the high frequency power supply 27's side and on a load side such as an electrode, plasma and the processing chamber 12. The matching device may include a blocking capacitor for generating a self bias. Details of a bias supplied to the supporting table 14 will be explained later. The supporting table 14 may be insulated from the bottom portion 22. Further, although not illustrated, a supporting mechanism to support the target substrate W or a temperature control mechanism to control a temperature may be included.

The gas supply unit 13 may include a center gas supply unit 32 having a gas supply opening 31 configured to supply a gas toward a central region of the target substrate W and an outer gas supply unit 35 having an annular-shaped hollow member 33 and gas supply openings 34 configured to supply the gas to the inner side in a diametric direction. Each of the center gas supply unit 32 and the outer gas supply unit 35 may supply a gas for a plasma process into the processing chamber 12 from the outside of the processing chamber 12. Flow directions of the gases supplied through the gas supply openings 31 and 34 are indicated by arrows $F_1$ and $F_2$ in FIG. 1, respectively. Further, gas flow rates of the gases supplied from the center gas supply unit 32 and the outer gas supply unit 35 may be arbitrarily selected. For example, a gas supply from the center gas supply unit 32 is stopped completely, and only the outer gas supply unit 35 may supply the gas into the processing chamber 12.

The microwave generator 15 having a microwave matching device 36 may be connected with an upstream side of the waveguide 16 configured to introduce a microwave via the coaxial waveguide 17 and a mode converter 39. The coaxial waveguide 17 includes a central conductor 37 and an outer peripheral conductor 38. The cylindrical central conductor and outer peripheral conductor 38 constituting the coaxial waveguide 17 may be positioned such that they may be aligned coaxially with each other. Further, there may be a space between an outer diameter surface of the central conductor 37 and an inner diameter surface of the outer peripheral conductor 38, and they may be extended vertically as illustrated in FIG. 1. By way of example, a TE mode microwave generated by the microwave generator 15 may pass through the waveguide 16 and may be converted into a TEM mode by the mode converter 39. Then, the TEM mode microwave may be propagated through the coaxial waveguide 17. A frequency of the microwave generated by the microwave generator 15 may be, for example, about 2.45 GHz.

The slot antenna plate 20 may be formed in a thin circular plate shape. Both opposite surfaces of the slot antenna plate 20 in its thickness direction may be flat. The slot antenna plate 20 may have the multiple slots 19 formed through the slot antenna plate 20 in its thickness direction. The slots 19 may include first slots 41 elongated in one direction and second slots 42 elongated in other direction orthogonal to the first slots 41 so as to make a pair. To be specific, every two adjacent slots 41 and 42 may make a pair formed in an approximately L-shape. That is, the slot antenna plate 20 may include slot pairs 43 made up of the first slots 41 elongated in one direction and the second slots 42 elongated in other direction orthogonal to the first slots 41. Further, an example of the slot pair 43 is shown in an area indicated by a dotted line in FIG. 2.

The slot pairs 43 may be divided roughly into an inner peripheral slot pair group 44 positioned on an inner peripheral side and an outer peripheral slot pair group 45 positioned on an outer peripheral side. In the inner peripheral slot pair group 44, seven slot pairs 43 may be equi-spaced along the periphery. In the outer peripheral slot pair group 45, twenty eight slot pairs 43 may be equi-spaced along the periphery. At a central region of the slot antenna plate 20, a through hole 46 may be formed. The slot antenna plate 20 may have rotational symmetry with respect to a diametric center 47 thereof.

The dielectric window 21 may be formed in an approximately circular plate shape and may have a certain thickness. The dielectric window 21 may be made of a dielectric material such as quartz or alumina. The dielectric window 21 may be airtightly provided in the plasma etching apparatus such that a lower side thereof may be mounted on the annular member 24 as illustrated in FIG. 1. In a periphery region of a lower surface 48 of the dielectric window 21 on the plasma generation side in the plasma etching apparatus 11, there may be formed a dielectric window recess 49 having an annular shape and a taper-shape toward an upward direction in FIG. 1. By the dielectric window recess 49, in the periphery region of the dielectric window 21, there may be formed a region in which a thickness of the dielectric window 21 is consecutively changed, and, thus, it may be possible to form a resonance region in which the dielectric window 21 has a thickness appropriate for various processing conditions for generating plasma. In this way, it may be possible to obtain plasma with high stability in a lower region of the dielectric window 21 depending on the various processing conditions.

The microwave generated by the microwave generator 15 may pass through the coaxial waveguide 17 and may be propagated into the dielectric plate 18. Then, the microwave may be radiated into the dielectric window 21 through the multiple slots 19 formed in the slot antenna plate 20. After passing through the dielectric window 21, the microwave may generate an electric field right below the dielectric window 21 and generate plasma within the processing chamber 12. The plasma generated right below the dielectric window 21 may be diffused in a direction away from the dielectric window 21, i.e. in a direction toward the supporting table 14. Then, in a plasma diffusion region, formed with the diffused plasma, having the target substrate W mounted on the supporting table 14, a plasma process such as plasma etching may be performed on the target substrate W. A plasma etching apparatus using the above-described slot antenna plate 20 may be referred to as a RLSA (Radial Line Slot Antenna) type plasma etching apparatus. With the plasma etching apparatus 11, a plasma process can be performed at a relatively low electron temperature and with a relatively high electron density. Therefore, it may be possible to suppress plasma damage to the target substrate W during the process and to perform the process at a high rate.

A gas used for an etching process may include an HBr gas, a $BCl_3$ gas, a $CF_3I$ gas, a $CH_2F_2$ gas, and a $CH_3F$ gas in addition to an inert gas such as an Ar (argon) gas and an $O_2$ gas containing O (oxygen) atoms. In case of using a gas that contains many H (hydrogen) atoms in its molecular structure, a compound having a low vapor pressure may be generated as a reaction by-product. To be specific, a target object to be etched may include, for example, silicon (Si). In case of performing the etching process on silicon as a target object, reaction by-products, which may vary depending on a gas used for the etching process, may include, for example, SiBrO, SiBr, SiI, and SiClO.

Hereinafter, there will be explained an example in which an etching process is performed on a target substrate with plasma by using the above-described plasma etching apparatus 11. Recently, to facilitate miniaturization of a device, an STI has been formed as a device isolation region. Above all, there will be briefly explained an example of performing an etching in a required shape, i.e. in a desirable shape, during a STI forming process.

Figure 3:
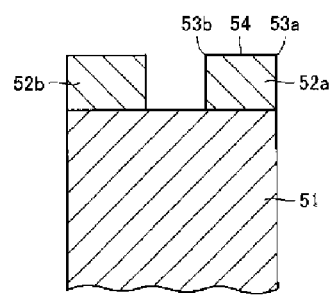
FIG. 3 is a schematic cross sectional view that shows a part of a target substrate on which a mask layer having a rectangular cross sectional shape is formed in a STI (Shallow Trench Isolation) forming process.
Figure 4:
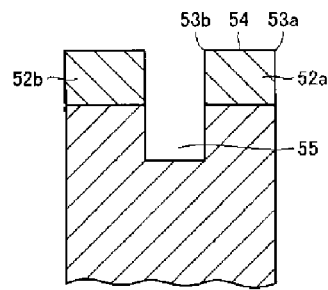
FIG. 4 is a schematic cross sectional view that shows a part of a target substrate having a desirable shape during etching in a STI forming process.
Figure 5:
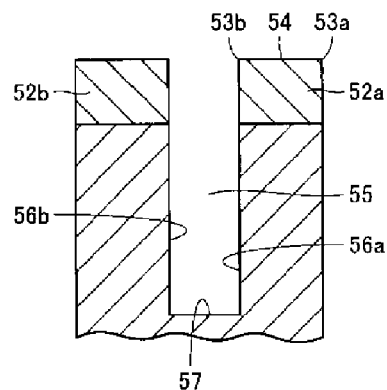
FIG. 5 is a schematic cross sectional view that shows a part of a target substrate having a desirable shape after etching in a STI forming process.

FIGS. 3, 4, and 5 are schematic cross sectional views each showing a part of a target substrate in this example. Referring to FIG. 3, on a silicon substrate 51 serving as the target substrate, mask layers 52a and 52b may be formed as a hard mask having a rectangular cross sectional shape. Thereafter, an etching may be performed. In this case, it is desirable that the mask layer 52a, e.g., corners 53a and 53b and a flat portion 54 between the corners 53a and 53b, are not be non-uniformly etched as depicted in FIG. 4. In other words, during an etching, it is desirable that the mask layers 52a and 52b be scarcely etched or upper regions of the mask layers 52a and 52b be uniformly etched downwards as depicted in FIG. 4. Then, a groove 55 may be formed by being etched vertically between the mask layers 52a and 52b. In the end, it may be possible to obtain a shape, as shown in FIG. 5, which is desirable. That is, desirably, both side walls 56a and 56b of the groove 55 may be extended straightly in a vertical direction and a bottom wall 57 positioned at a lowermost position of the side walls 56a and 56b and configured to form the groove 55 together with the side walls 56a and 56b may be extended straightly in a horizontal direction.

Figure 6:
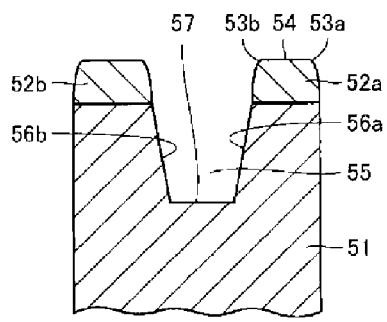
FIG. 6 is a schematic cross sectional view that shows a part of a target substrate having tapered side walls during etching in a STI forming process.

However, by way of example, if an etching gas with a high anisotropy is used, the mask layers 52a and 52b may be etched gradually by etching as depicted in FIG. 6. In this case, the corners 53a and 53b of the mask layer 52a may be etched more than the flat portion 54.

Figure 7:
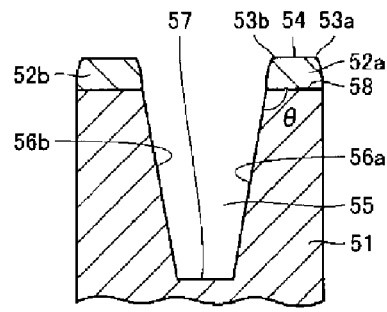
FIG. 7 is a schematic cross sectional view that shows a part of a target substrate having tapered side walls after etching in a STI forming process.

Thus, in the end, as depicted in FIG. 7, the groove 55 formed between the mask layers 52a and 52b by etching may have the side walls 56a and 56b in a taper shape. That is, the side walls 56a and 56b may not be extended straightly in the vertical direction. In this case, an angle θ formed by an upper end 58 of the silicon substrate 51 and the side wall 56a may be an obtuse angle. However, the taper shape may not be appropriate for etching and may not be desirable. FIG. 6 shows a cross sectional view corresponding to that of FIG. 4 described above, and FIG. 7 shows a cross sectional view corresponding to that of FIG. 5 described above.

Particularly, since a demand for miniaturization has been increased in recent years, a resist mask layer may become thinner, and a hard mask may become thinner accordingly. Under this circumstance, in order to prevent the groove 55 from being formed in a taper shape, it may be necessary to perform an etching process with high selectivity for the silicon substrate 51 over a hard mask so as not to etch the mask layers 52a and 52b. In this case, however, etching conditions may be limited, and, thus, it may be desirable to avoid performing this kind of etching if possible.

Figure 8:
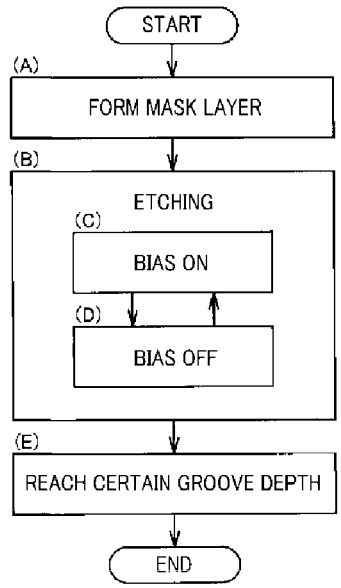
FIG. 8 is a flowchart showing a representative process of a plasma etching method in a STI forming process in accordance with the embodiment of the present disclosure.

Hereinafter, there will be explained a plasma etching process in accordance with the embodiment of the present disclosure by reference to FIG. 8. FIG. 8 is a flowchart showing a representative process of a plasma etching method in a STI forming process in accordance with the embodiment of the present disclosure. As depicted in FIG. 3, on the silicon substrate 51 serving as the target substrate W, mask layers 52a and 52b may be formed (FIG. 8(A)). Then, by using the plasma etching apparatus 11 depicted in FIG. 1, a plasma etching may be performed (FIG. 8(B)). At this time, in a STI forming process, the etching may be performed by supplying a gaseous mixture of an argon (Ar) gas, a hydrogen bromide (HBr) gas, and an oxygen ($O_2$) gas.

In this case, a bias power may be intermittently supplied to the target substrate W through the supporting table 14 by alternately repeating supply and stop of the bias power through the control unit. That is, during an etching, the bias power may be intermittently supplied by alternately repeating turning on (FIG. 8(C)) and turning off (FIG. 8(D)) the AC bias power from the high frequency power supply 27 serving as a bias power supply unit.

In this way, the etching may be performed by alternately repeating bias on and bias off. Further, as depicted in FIG. 5, when a vertical position of the bottom wall 57 is positioned as desired, i.e. when the bottom wall 57 reaches a certain depth of the groove, the etching may be ended (FIG. 8(E)). By way of example, when a certain time passes after the etching starts, it may be regarded that the vertical position of the bottom wall 57 has reached the certain position or the etching may be ended by measuring a vertical length between the upper end 58 of the silicon substrate 51 and the bottom wall 57 thereof.

Figure 9:
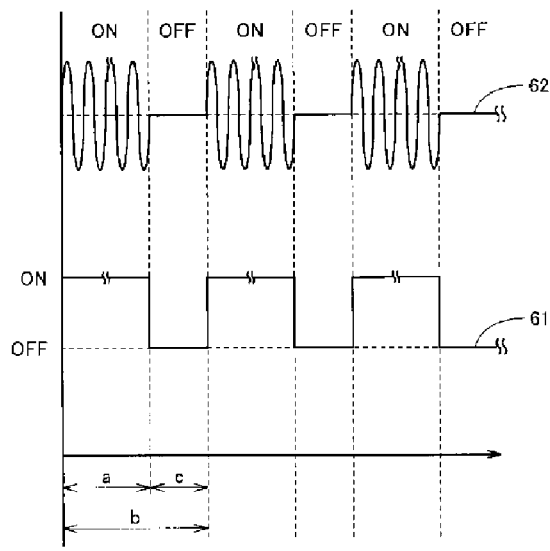
FIG. 9 is a graph showing an ON/OFF state of an AC bias.

Hereinafter, there will be provided details of the bias power intermittently supplied in this case. FIG. 9 is a graph showing an ON/OFF state of an AC bias in the STI forming process. In FIG. 9, a longitudinal axis represents an ON/OFF state of the bias and a horizontal axis represents a time. In the longitudinal axis, regarding a rectangular waveform indicated by a line 61, an upper line shows an ON state and a lower line shows an OFF state. Further, regarding a waveform indicated by a line 62, a vertically oscillating period shows an ON state and a non-oscillating period shows an OFF state. Referring to FIG. 9, a supply time (a) of the AC bias power is shown as "a" in FIG. 9. Further, a total time (b) including the supply time (a) and a stop time of the AC bias power is shown as "b" in FIG. 9. Furthermore, the stop time of the AC bias power is shown as "c", which is "b" minus "a", in FIG. 9.

Herein, desirably, in the STI forming process, supply of the bias power may be controlled by adjusting a duty ratio (a/b) of the supply time (a) of the AC bias power to the total time (b) including the supply time (a) and the stop time of the AC bias power to be higher than about 0.5 and lower than about 1.0. That is, desirably, the bias power may be intermittently supplied by adjusting the duty ratio (a/b) to be higher than about 0.5 and lower than about 1.0.

With this configuration, the etching can be performed by using a modified (reformed) protective film as described below. Thus, it may be possible to perform the etching to obtain a desirable shape with more accuracy.

A principle of this etching process can be explained by reference to the following case. That is, if the bias power is intermittently supplied, an OFF state of the bias, i.e. a state in which the bias power is not supplied, and an ON state of the bias, i.e. a state in which the bias power is supplied, may be repeated alternately during the plasma etching.

Figure 10:
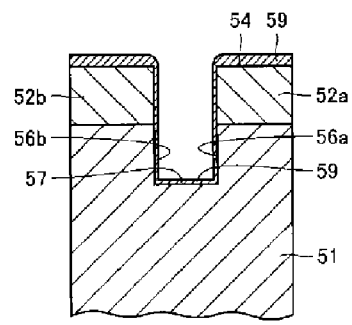
FIG. 10 shows a part of a target substrate when a bias is in an ON state during etching in a STI forming process.

FIG. 10 is a schematic cross sectional view showing a part of a target substrate in this case and corresponds to FIGS. 4 and 6. When the bias is in an OFF state, a very thin protective film 59 made of a deposit (reaction by-product) produced when the bias is in an ON state may be formed on the entire surface of the silicon substrate 51. In this case, the mask layers 52a and 52b may be positioned at the upper region in the vertical direction, i.e. may be positioned closer to the plasma than a vicinity of the bottom wall 57. Therefore, the protective film 59 formed on the mask layers 52a and 52b may be thicker than the protective film 59 formed on the bottom wall 57 of the groove 55.

Then, the protective film 59 may be modified (reformed) by radicals existing in a vicinity of the silicon substrate 51. The modification (reformation) may vary depending on a gas used therefor and may include, for example, nitrification, oxidation, bromination, carbo bromination, chlorination or the like. This modification is to harden the film. It may be highly probable that radicals may exist in a vicinity of the mask layers 52a and 52b rather than a vicinity of the bottom wall 57. Accordingly, an effect of modifying (reforming) the protective film 59 may be more remarkable in the vicinity of the mask layers 52a and 52b. That is, a degree of the modification of the protective film 59 formed on the mask layers 52a and 52b may be higher than a degree of the modification of the protective film 59 formed on the bottom wall 57 of the groove 55. Thus, the protective film 59 formed on the mask layers 52a and 52b may be hardened more than the protective film 59 formed on the bottom wall 57.

Figure 11:
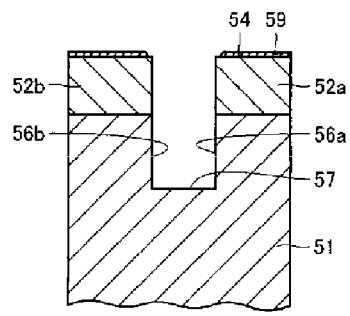
FIG. 11 shows a part of a target substrate when a bias is in an OFF state during etching in a STI forming process.

Thereafter, the bias may become in an ON state. FIG. 11 is a schematic cross sectional view showing a part of a target substrate in this case and corresponds to FIGS. 4 and 6. When the bias is in an ON state, the entire surface of the silicon substrate 51 may be etched. In this case, since the mask layers 52a and 52b may be positioned in a position higher than the bottom wall 57, the modified protective film 59 may be etched at a region where an etching effect is relatively strong. However, since the protective film 59 formed on the mask layers 52a and 52b may be relatively thick and hardened by the modification, the mask layers 52a and 52b may be scarcely etched. On the contrary, since the protective film 59 formed on the bottom wall 57 may be relatively thin and scarcely modified, it may not be so hardened. Therefore, although an etching effect may be relatively weak at the bottom wall 57, the protective film 59 formed on the bottom wall 57 may be etched early. Then, the bottom wall 57 of the silicon substrate 51 may be actively etched downwards in a vertical direction.

The etching may be performed by alternately repeating bias on and bias off. Thus, while preventing the mask layers 52a and 52b from being etched by etching, a required shape of the groove can be obtained by continuously etching the groove between the mask layers 52a and 52b downwards in a vertical direction. That is, by repeating bias on and bias off at the above-described time interval, it may be possible to perform the etching in a required shape with more accuracy. It is deemed that the etching may be performed based on the above-described principle. For convenience of understanding, the protective film 59 of FIGS. 10 and 11 is illustrated as being thick in an exaggerated form. Further, a protective film of the following figures is also illustrated as being thick in an exaggerated form.

Figure 12:
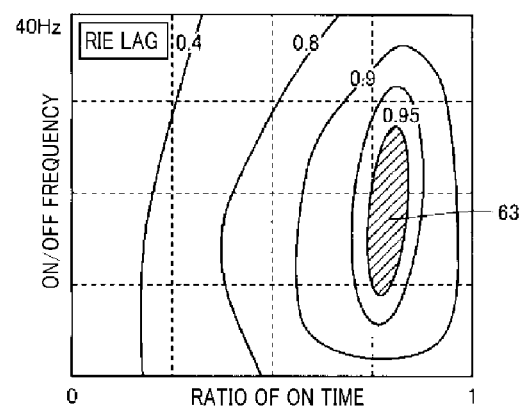
FIG. 12 is a contour view of a RIE (Reactive Ion Etching) lag.
Figure 13:
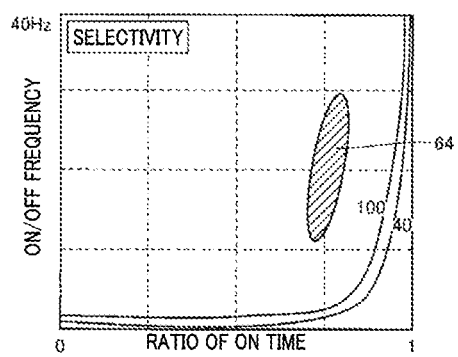
FIG. 13 is a contour view of etching selectivity.

FIG. 12 is a contour view of a RIE lag. FIG. 13 is a contour view of etching selectivity. In FIGS. 12 and 13, a longitudinal axis represents an ON/OFF frequency of a bias power, and a horizontal axis represents a ratio of ON time, i.e. the duty ratio. In this case, during the etching, an oxygen gas may be contained in a reaction gas by about 0.2%. That is, a ratio of the gas containing oxygen atoms to the whole reaction gas may be about 0.2%.

Figure 14:
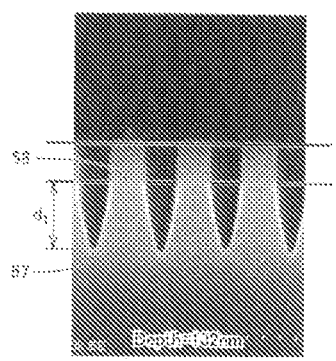
FIG. 14 is an electron micrograph showing a part of a silicon substrate after etching, when viewed from a horizontal direction, in case of a small width of an etched region with a duty ratio of about 0.25.
Figure 15:
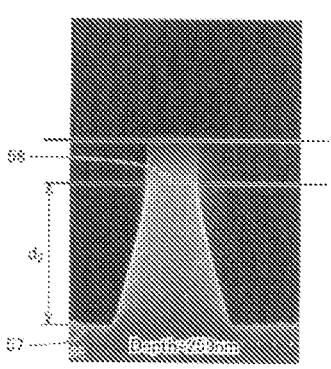
FIG. 15 is an electron micrograph showing a part of a silicon substrate after etching, when viewed from a horizontal direction, in case of a large width of an etched region with a duty ratio of about 0.25.

A RIE lag will be explained as follows. FIGS. 14 and 15 are electron micrographs each showing a part of a silicon substrate, when viewed from a horizontal direction, after etching. FIG. 14 shows a silicon substrate etched by etching when a width of an etched portion is small, and FIG. 15 shows a silicon substrate etched by etching when a width thereof is large. Referring to FIGS. 14 and 15, if a vertical length from the upper end 58 to the bottom wall 57 of the silicon substrate when the etched width is small is represented as $d_1$. Further, a vertical length from the upper end 58 to the bottom wall 57 of the silicon substrate cut when the etched width is large is represented as $d_2$. A RIE lag may be represented as $d_1/d_2$. In an etching, it is desirable that the vertical length from the upper end 58 to the bottom wall 57 is the same regardless of the etched width. Therefore, it is desirable that the RIE lag may be close to about 1. Further, it is also desirable that selectivity may have a value as high as possible. That is, desirably, a ratio of etching an underlying layer, i.e. the silicon substrate with respect to the mask layer may have a value as high as possible. In FIGS. 14 and 15, the duty ratio is about 0.25.

Referring to FIG. 12, if the ratio of bias ON time is low, to be specific, if the duty ratio is lower than about 0.5, the RIE lag may be lower than at least about 0.9 regardless of the ON/OFF frequency. When the duty ratio is near about 0.75, the RIE lag may be closer to about 1. In particular, when the ON/OFF frequency is in a range of from about 10 Hz to about 30 Hz, as illustrated in a hatched area 63 of FIG. 12, a desirable RIE lag with a value higher than about 0.95 may be obtained. Therefore, it is desirable that a ON/OFF frequency of a bias power supplied by the high frequency power supply serving as the bias power supply unit may be in a range of from about 10 Hz to about 30 Hz.

Referring to FIG. 13, the selectivity becomes lower as it goes toward the lower right of the graph. This may indicate that if the ON/OFF frequency is low and the duty ratio is high, the selectivity becomes lower. If the duty ratio is higher than about 0.75 and the ON/OFF frequency is higher than about 10 Hz, the selectivity may be about 100. Herein, desirably, the selectivity may be selected from an area 64 which is hatched to be overlapped with the area 63 indicating a favorable RIE lag in FIG. 12.

Figure 16:
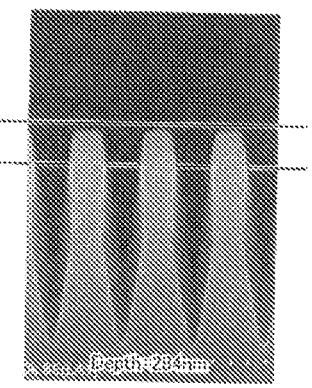
FIG. 16 is an electron micrograph showing a part of a silicon substrate after etching, when viewed from a horizontal direction, in case that a width of an etched region is small and a bias power is consecutively applied thereto.
Figure 17:
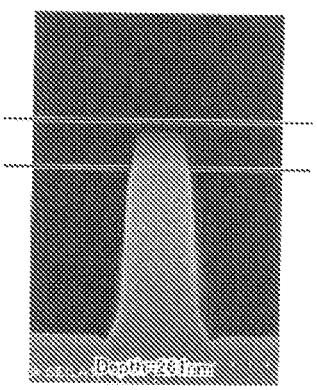
FIG. 17 is an electron micrograph showing a part of a silicon substrate, when viewed from a horizontal direction, after etching in case that a width of an etched region is large and a bias power is consecutively applied thereto.
Figure 18:
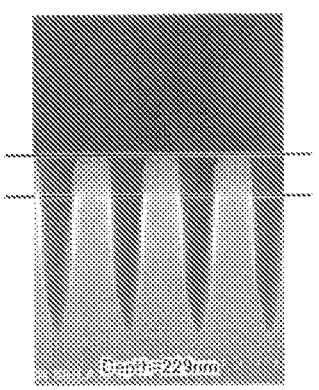
FIG. 18 is an electron micrograph showing a part of a silicon substrate, when viewed from a horizontal direction, after etching in case of a small width of an etched region with a duty ratio of about 0.75.
Figure 19:
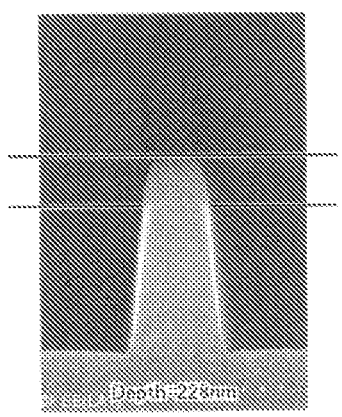
FIG. 19 is an electron micrograph showing a part of a silicon substrate, when viewed from a horizontal direction, after etching in case of a large width of an etched region with a duty ratio of about 0.75.

FIGS. 16 and 17 are electron micrographs each showing a part of a silicon substrate after etching, when viewed from a horizontal direction, in case that a bias power is continuously applied to the silicon substrate, i.e. the duty ratio is about 1. FIG. 16 shows a silicon substrate in case of a small width of an etched region, and FIG. 17 shows a silicon substrate in case of the large width. FIGS. 18 and 18 are electron micrographs each showing a part of a silicon substrate after etching with a duty ratio of about 0.75, when viewed from a horizontal direction. FIG. 18 shows a silicon substrate in case of the small width of an etched region, and FIG. 19 shows a silicon substrate in case of the large width thereof.

Referring to FIGS. 14 to 19, if a bias is in an ON state consecutively, i.e. the duty ratio is about 1, in case the etched width is small, a shape of a groove may has a sharp point at the bottom thereof. The sharp point may become a singularity and may easily cause an abnormal discharge due to a concentration of an electric field. If the duty ratio is about 0.25, side walls may become tapered easily. Further, the RIE lag may become lower than about 0.5. That is, the vertical length from the bottom wall to the upper end in case of the small width may be greatly different from the vertical length from the bottom wall to the upper end in case of the large width. In this case, the one with the small width may have a shallow groove.

On the contrary, if the duty ratio is about 0.5 or higher, a tendency for the side walls to become tapered may be greatly relieved. That is, the side walls may be extended approximately straightly in a vertical direction. Further, the RIE lag may be increased to about 0.8 or higher. In particular, if the duty ratio is about 0.75, regardless of whether the etched width is small or large, the vertical length from the bottom wall to the upper end may have a substantially constant value.

Further, in this case, desirably, a pressure within the processing chamber may be in a range of from about 10 mTorr to about 200 mTorr for the sake of stability of the process.

Furthermore, in this case, desirably, energy of the bias supplied from the high frequency power supply serving as the bias power supply unit may be about 200 eV or lower for reducing plasma damage to the target substrate.

Moreover, in this case, it may be desirable to control a thickness of a protective film formed when the bias is in an OFF state to be about 100 Å (angstrom) or smaller. In this way, it may be possible to prevent the protective film from becoming excessively thick, and also possible to perform etching in a desirable shape with more accuracy.

Further, in this case, since the plasma etching apparatus 11 may generate plasma by using a microwave, it may be possible to generate plasma containing sufficient radicals. For this reason, the deposit (reaction by-product) produced when the bias is an ON state can be modified efficiently, and, thus, the protective film 59 having sufficient etching resistance can be formed. It is deemed that the protective film 59 may be primarily made of SiBrO modified by oxygen radicals. Herein, a ratio of the oxygen gas to the whole reaction gas may be, but is not limited to, about 0.2%. By way of example, if the ratio of the oxygen gas is about 0.2% or higher, the optimum areas 63 and 64 depicted in FIGS. 12 and 13 may be shifted to the right in each drawing. Meanwhile, if the ratio of the oxygen gas is about 0.2% or lower, the optimum areas 63 and 64 depicted in FIGS. 12 and 13 may be shifted to the left in each drawing. A lower limit ratio capable of stably supplying the oxygen gas may be about 0.05%. Further, the ratio of the oxygen gas may be about 5% or lower, considering the RIE lag and the selectivity. If the ratio of the oxygen gas is about 5% or higher, the optimum areas 63 and 64 may be shifted to an area where the duty ratio is about 1, and, thus, an etched portion may have a sharp point. In order to meet various processes (various conditions), the ratio of the oxygen gas may be in a range of from about 0.1% to about 1%.

Further, an internal pressure of the processing chamber may be controlled so as to be a desired level while supplying a gas into a processing chamber and exhausting the inside of the processing chamber by a TMP. In this way, the plasma process may be performed. If reaction by-products are generated during the plasma process, most of the reaction by-products may be discharged to the outside of the processing chamber by the TMP. By way of example, if silicon is etched during the plasma process, the above-described SiBrO may be generated as a reaction by-product. When the reaction by-product such as SiBrO having a low vapor pressure is generated, there is a concern that the reaction by-product may adhere to a sidewall of a groove of a pattern formed by the etching process before the reaction by-product is discharged to the outside of the processing chamber by the TMP.

As explained with reference to FIG. 12, it has been described in the above-described embodiment that, desirably, an ON/OFF frequency of a bias power may be in a range of from about 10 Hz to about 30 Hz in order to improve RIE lag.

However, if there is a concern that the reaction by-product adheres to the sidewall of the groove, it may be possible to adjust the ON/OFF frequency to be in a range of, for example, from about 5 Hz to about 10 Hz. To be specific, by way of example, if an internal pressure of the processing chamber is about 100 mTorr, a duty ratio is about 0.5, and an ON/OFF frequency of a bias power is about 5 Hz, the AC bias power may be applied consecutively for about 0.1 second, i.e. about 100 milliseconds. Subsequently, the AC bias power may not be applied for about 100 milliseconds. By allowing this state in which the bias power is not applied for about 100 milliseconds, even if a reaction by-product has a relatively low vapor pressure, the reaction by-product may not adhere to the sidewall and can be discharged to the outside of the processing chamber by the TMP. For this reason, depending on a reaction by-product generated, it is also possible to adopt the ON/OFF frequency of the bias power in the range of from about 5 Hz to about 10 Hz.

Hereinafter, there will be explained another embodiment of the present disclosure. Recently, during etching for forming a SAC (Self Align Contact), the following problem may occur. Above all, there will be briefly explained an example in which in a SAC forming process, etching is performed in a desirable shape, i.e. in a so-called ideal shape.

Figure 20:
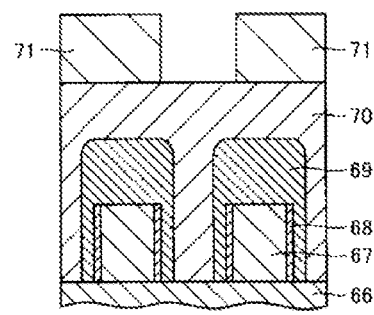
FIG. 20 is a schematic cross sectional view that shows a part of a target substrate on which a mask layer having a rectangular cross sectional shape is formed in a SAC (Self Align Contact) forming process.
Figure 21:
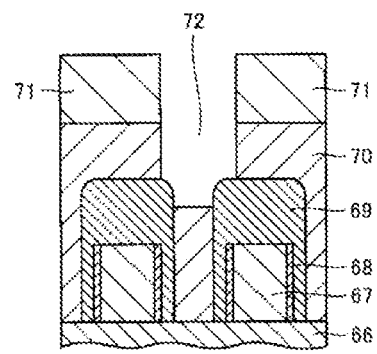
FIG. 21 is a schematic cross sectional view that shows a part of a target substrate having a desirable shape during etching in a SAC forming process.
Figure 22:
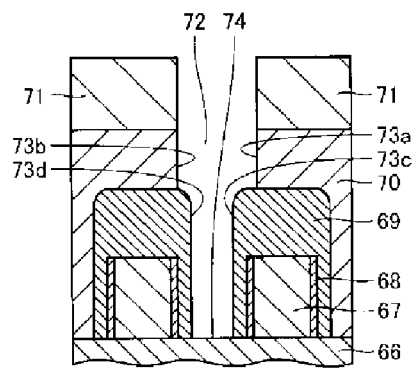
FIG. 22 is a schematic cross sectional view that shows a part of a target substrate having a desirable shape after etching in a SAC forming process.

FIGS. 20, 21 and 22 are schematic cross sectional views each showing a part of a target substrate in the above-described example. Referring to FIG. 20, on a silicon substrate 66 serving as a target substrate W, a gate electrode layer 67, a gate side wall 68, a silicon nitride film layer 69, and a silicon oxide film layer 70 may be formed, and a mask layer 71 having a rectangular cross sectional shape may be formed thereon in that order. Then, as depicted in FIG. 21, a part of the silicon oxide film layer 70 between the mask layers 71 may be etched by etching so as to form a groove 72. Further, as depicted in FIG. 22, the etching may be performed until the silicon substrate 66 is exposed.

As described above, the plasma etching may be performed in the SAC forming process. In this case, the formed groove 72 may include side walls 73a and 73b of the silicon oxide film layer 70 positioned on an upper side, side walls 73c and 73d of the silicon nitride film layer 69 positioned on a lower side, and a bottom wall 74 positioned between the side walls 73c and 73d. At this time, the etching may be performed in an ideal shape in which only the silicon oxide film layer 70 may be etched and the silicon nitride film layer 69 may not be etched by strictly controlling a position of the mask layer 71 when forming the mask layer 71. Therefore, a gap between the side walls 73a and 73b of the silicon oxide film layer 70 may be wider than a gap between the side walls 73c and 73d of the silicon nitride film layer 69 as depicted in FIG. 22, so that a part of the silicon nitride film layer 69 may be exposed to the groove 72.

Figure 23:
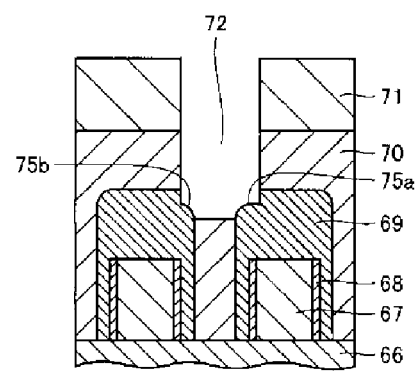
FIG. 23 is a schematic cross sectional view that shows a part of a target substrate when side walls of a silicon nitride film is etched during etching in a SAC forming process.

When the plasma etching is performed in the SAC forming process, the following problem may occur. That is, if etching selectivity of the silicon oxide film layer 70 to the silicon nitride film layer 69 is low, the silicon nitride film layer 69 may be etched during etching. Further, as depicted in FIG. 23, regions 75a and 75b of the silicon nitride film layer 69 between the mask layers 71 may be etched gradually.

Figure 24:
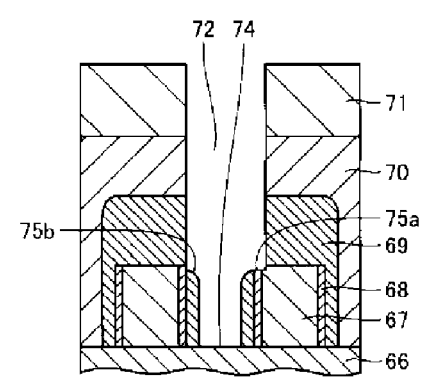
FIG. 24 is a schematic cross sectional view that shows a part of a target substrate when a gate electrode layer is exposed after etching in a SAC forming process.

At this time, the etching may be performed while the mask layer 71 is deviated in a horizontal direction without strictly controlling a position of the mask layer 71 when forming the mask layer 71. Then, when the etching performed on the silicon oxide film layer 70 is ended, i.e. when the silicon oxide film layer 70 is completely removed between the mask layers 71 and the bottom wall 74 of the groove 72 reaches the silicon substrate 66, as depicted in FIG. 24, the regions 75a and 75b of the silicon nitride film layer 69 may be etched downwards and a part of the gate electrode layer 67 may be exposed to the groove 72, as shown in the region 75a. This may not be a desirable situation since an insulation break may occur in the region 75a. That is, a desirable shape may not be obtained.

In order to prevent the insulation break, it may be necessary to strictly control a position of the mask layer 71 when forming the mask layer 71 or to perform etching with high selectivity. However, such action may not be desirable considering efforts or time.

Figure 25:
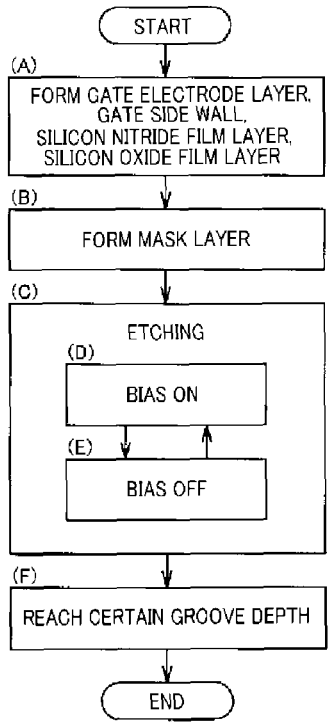
FIG. 25 is a flowchart showing a representative process of a plasma etching method in a SAC forming process in accordance with another embodiment of the present disclosure.

Hereinafter, referring to FIG. 25, there will be explained a plasma etching method in accordance with another embodiment of the present disclosure. FIG. 25 is a flowchart showing a representative process of a plasma etching method in this case. Above all, as depicted in FIG. 20, on the silicon substrate 66 serving as the target substrate W, the gate electrode layer 67, the gate side wall 68, the silicon nitride film layer 69, and the silicon oxide film layer 70 may be formed (FIG. 25(A)). Then, the mask layer 71 may be formed on the silicon oxide film layer 70 (FIG. 25(B)). Subsequently, by using the plasma etching apparatus 11 depicted in FIG. 1, the plasma etching may be performed (FIG. 25(C)). In this case, in a SAC forming process, the etching may be performed by using a gas having a multiple dissociation property such as a $C_4F_8$ gas or a $CH_2F_2$ gas.

In this case, a bias power may be intermittently supplied to the target substrate W through the supporting table 14 by alternately repeating supply and stop of the bias power through the control unit. That is, during the etching, bias power may be intermittently supplied by alternately repeating bias on (FIG. 25(D)) and bias off (FIG. 25(E)) of AC bias power from the bias power supply unit.

In this way, the etching may be performed by alternately repeating bias on and bias off. Further, when a vertical position of a bottom wall 74 is positioned as desired, i.e. when a groove depth reaches a certain value, the etching may be ended (FIG. 25(F)). By way of example, the etching may be ended when a certain time passes after the etching starts, assuming that the vertical position of the bottom wall 74 has reached a target position. Alternatively, the etching may be ended when a measured vertical length between an upper end 77 of the mask layer 71 and the bottom wall 74 becomes a target value while monitoring the vertical length.

In this case, it may be desirable to control the supply of the bias power by adjusting the duty ratio (a/b) of the supply time (a) of the AC bias power to the total time (b) including the supply time (a) and the stop time of the AC bias power to be higher than about 0.5 and lower than about 1.0.

As described above, the etching may be performed in the SAC forming process. In this way, it may be possible to perform the etching in a desirable shape with high accuracy in the SAC forming process.

A principle of this etching process can be explained by reference to the following case. That is, if the bias power is intermittently supplied, an OFF state of the bias, i.e. a state in which the bias power is not supplied, and an ON state of the bias, i.e. a state in which the bias power is supplied, may be repeated alternately during the plasma etching.

Figure 26:
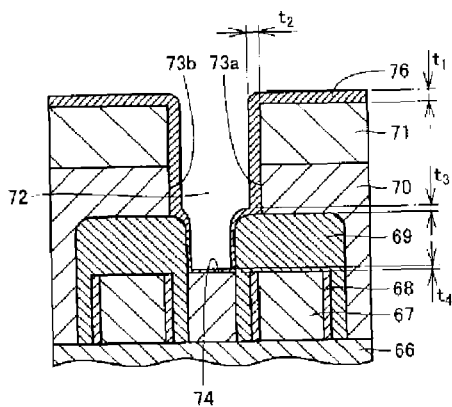
FIG. 26 is a schematic cross sectional view that shows a part of a target substrate when a bias is in an OFF state in a SAC forming process.

FIG. 26 is a schematic cross sectional view that shows a part of a target substrate when a bias is in an OFF state. Referring to FIG. 26, when a bias is in an OFF state, a protective film 76 made of a deposit may be formed on the mask layer 71 and the partially exposed silicon nitride film layer 69. The formed protective film 76 may be made of a CH (hydrocarbon)-based polymer or a CF (fluorocarbon)-based polymer such as $CHF_3$ or $CH_2F_2$, and SiC.

The protective film 76 made of the deposit may be getting thicker as it approaches a region close to plasma in a plasma process, i.e. an upper region shown in FIG. 26. To be specific, a thickness $t_1$ of the protective film 76 formed on the mask layer 71, a thickness $t_2$ of the protective film 76 formed on a side of a side wall 73a, and a thickness $t_3$ of the protective film 76 formed on the silicon nitride film layer 69 may become thicker relatively.

Meanwhile, the protective film 76 formed on the bottom wall 74 may be provided on a lower region in a vertical direction, and the protective film 76 may be scarcely formed or may be formed very thinly. This is because the deposit which is a basic material of the protective film 76 may not reach throughout the lower region although the aspect ratio may vary depending on the shape of the groove 72. To be specific, a thickness $t_4$ of the protective film 76 formed on the bottom wall 74 may become thinner relatively.

Figure 27:
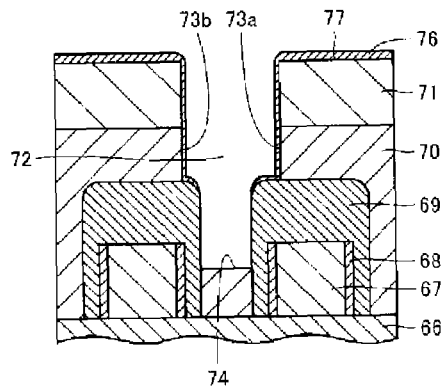
FIG. 27 is a schematic cross sectional view that shows a part of a target substrate when a bias is in an ON state in a SAC forming process.

FIG. 27 is a schematic cross sectional view that shows a part of a target substrate when a bias is in an ON state. Referring to FIG. 27, when the bias is in an ON state, plasma etching may be performed. In this case, the protective film 76 formed on the mask layer 71 or on the silicon nitride film layer 69 may be etched first. At this time, the protective film 76 formed on the upper region may be thick enough to prevent the mask layer 71 from being etched. Only some part of the protective film 76 may be etched. Likewise, the protective film 76 on the silicon nitride film layer 69 may be thick relatively. Therefore, during etching, i.e. while the bias is in an ON state, the protective film 76 formed on the silicon nitride film layer 69 may be etched, but the silicon nitride film layer 69 serving as an underlying layer may be scarcely etched. That is, while the bias is in an ON state, the protective film 76 formed on the mask layer 71 or on the silicon nitride film layer 69 may become thin, but may still remain. Meanwhile, the protective film 76 thinly formed on the bottom wall 74 may be etched early, and the silicon oxide film layer 70 serving as the underlying layer may be etched downwards in the vertical direction.

That is, since the mask layer 71 or the silicon nitride layer 69 may be positioned at a relatively upper region, the protective film 76 made of the deposit formed when the bias is in an OFF state may become thicker relatively. When the bias is in an ON state, the protective film 76 may be actively etched but the mask layer 71 or the silicon nitride film layer 69 serving as the underlying layer may be scarcely etched. On the contrary, since the silicon oxide film layer 70 may be positioned at a relatively lower region of the groove 72, the protective film 76 made of the deposit formed when the bias is in an OFF state may become thinner relatively. When the bias is in an ON state, the protective film 76 may be etched early and the silicon oxide film 70 serving as the underlying layer of the protective film 76 may be etched downwards in the vertical direction.

As described above, the etching may be performed in a desirable shape with efficiency by performing the plasma etching in forming the SAC. That is, even if a position of the mask layer 71 is not strictly controlled when forming the mask layer 71 and the formed mask layer 71 is slightly deviated in a horizontal direction, the etching may be performed with more accuracy in a desirable shape by suppressing etching of the silicon nitride film layer 69 exposed during etching to prevent the gate electrode layer 67 from being exposed.

Further, in this case, it may be desirable to control a thickness of the protective film formed when the bias is in an OFF state to be about 100 Å or lower. In this way, it may be possible to prevent the protective film from becoming excessively thick, and also possible to perform the etching in a desirable shape with more accuracy.

Hereinafter, there will be explained still another embodiment of the present disclosure. Recently, during a spacer etching, the following problem may occur. Above all, there will be briefly explained an example in which in a spacer etching, etching is performed in a desirable shape, i.e. in a so-called ideal shape.

Figure 28:
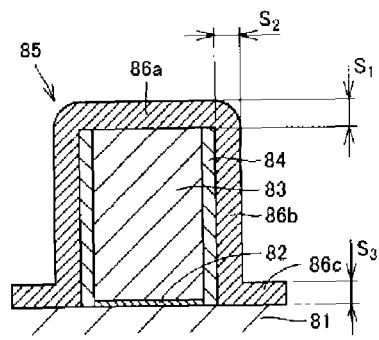
FIG. 28 is a schematic cross sectional view that shows a part of a target substrate on which a gate electrode layer is formed in a spacer etching process.
Figure 29:
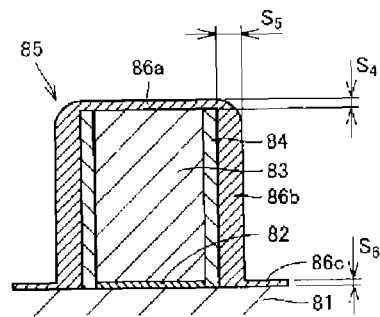
FIG. 29 is a schematic cross sectional view that shows a part of a target substrate having a desirable shape after a first etching in a spacer etching process.
Figure 30:
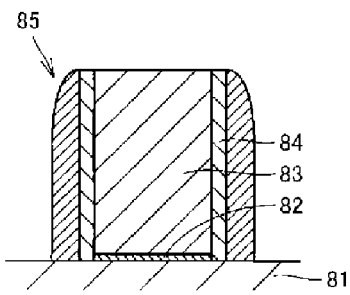
FIG. 30 is a schematic cross sectional view that shows a part of a target substrate having a desirable shape after a second etching in a spacer etching process.

FIGS. 28, 29 and 30 are schematic cross sectional views each showing a part of a target substrate in the above-described example. Referring to FIG. 28, on a silicon substrate 81 serving as the target substrate W, a gate insulating film layer 82, a gate electrode layer 83, and a gate side wall 84 may be formed. In addition, a spacer layer 85 as an insulating layer may be formed so as to cover them. In this case, as depicted in FIG. 28, a thickness $s_1$ of the spacer layer 85 formed at an upper region 86a of the gate electrode layer 83 may be substantially the same as a thickness $s_2$ of the spacer layer 85 formed at a side region 86b of the gate side wall 84. A thickness $s_3$ of the spacer layer 85 formed at an end region 86c may be slightly thinner than the thickness $s_1$ or the thickness $s_2$. The end region 86c may be formed on a horizontal side of the side region 86b and on the silicon substrate 81.

Thereafter, as a first etching process, an etching may be performed with ion energy in a vertical direction. In the spacer layer 85, regions extended in an upper/lower direction, i.e., a vertical direction, may be relatively merely etched, and regions extended in a right/left direction, i.e., a horizontal direction, may be actively etched as depicted in FIG. 29. To be specific, the spacer layer 85 on the side region 86b extended in the vertical direction may have a thickness $s_5$ after the first etching process. The thickness $s_6$ may be scarcely changed as compared with the thickness $s_2$ before the first etching process. Meanwhile, the spacer layer 85 on the upper region 86a extended in the horizontal direction may have a thickness $s_4$ after the first etching process. The thickness $s_4$ may be greatly decreased as compared with the thickness $s_1$ before the first etching process. In the same manner as the upper region 86a, the end region 86c of the spacer layer 85 extended in the horizontal direction may have a thickness $s_6$ after the first etching process. The thickness $s_6$ may also be greatly decreased as compared with the thickness $s_3$ before the first etching process. In this way, the first etching process may be performed. The first etching process may be performed until the spacer layer 85 on the end region 86c is not completely removed, but slightly remained.

Thereafter, as a second etching process, etching may be performed such that the slightly remaining spacer layer 85 on the end region 86c may be completely removed and an upper surface of the silicon substrate 81 in this region may be exposed. That is, the etching may be performed until the thickness $s_6$ at the end region 86c of FIG. 29 is about 0. In this case, considering selectivity between the silicon substrate 81 serving as the underlying layer and the spacer layer 85 serving as an etched layer, chemical etching may be performed with radicals. Thus, as depicted in FIG. 30, the spacer layer 85 may be formed on a region extended in the vertical direction along the side region 86b.

Such an etching may be a so-called two-step etching process. That is, in an etching process of the spacer layer 85, during the first etching process, anisotropic etching may be performed with relatively strong bias power such that the region extended in the vertical direction may remain and the region extended in the horizontal direction may be actively etched. In this way, a shape depicted in FIG. 29 can be obtained efficiently by saving time as much as possible. Further, during the second etching process, considering selectivity, isotropic etching may be performed with weak bias power such that the remaining spacer layer 85 on the end region 86c may be etched and the silicon substrate 81 may be exposed in the horizontal side of the side region 86b of the spacer layer 85. As described above, the spacer etching may be performed. Based on this two-step etching process, it may be possible to efficiently obtain the silicon substrate with the shape depicted in FIG. 30 by preventing the silicon substrate 81 at the end region 86c from being excessively etched.

However, it is concerned that this process may cause the following problem. Since isotropy is important in the second etching process, the bias power may be controlled to be low during the etching. However, if the bias power is controlled to be low, the spacer layer 85 in the side region 86b may be etched by the etching having an isotropic property. That is, the thickness $s_5$ of the spacer layer 85 in the side region 86b may become thinner and the spacer layer 85 in the side region 86b may become narrower. Since it may be desirable for the thickness $s_5$ to be as thick as possible, this situation may not be desirable.

In this case, it may be desirable for the spacer layer remaining on the end region to be as thin as possible in the first etching process, but such a strict control may not be desirable considering efforts or time.

Figure 31:
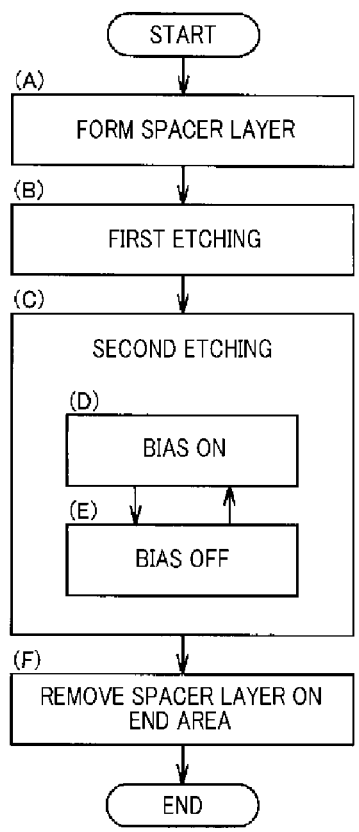
FIG. 31 is a flowchart showing a representative process of a plasma etching method in a spacer etching process in accordance with another embodiment of the present disclosure.

Hereinafter, referring to FIG. 31, there will be explained a plasma etching apparatus in accordance with another embodiment of the present disclosure. FIG. 31 is a flowchart showing a representative process of a plasma etching method in accordance with another embodiment of the present disclosure. First, as depicted in FIG. 28, on the silicon substrate 81 serving as the target substrate W, the gate insulating film layer 82, the gate electrode layer 83 and the gate side wall 84 may be formed. In addition, the spacer layer 85 may be formed so as to cover them (FIG. 31(A)).

Then, by using the plasma etching apparatus 11 depicted in FIG. 1, the first etching process may be performed (FIG. 31(B)). In the first etching process, the bias power may be controlled to be relatively strong so as to actively perform etching in a vertical direction and the spacer layer 85 may be etched by using mainly ion energy. This first etching process may be ended when the spacer layer 85 on the end region 86c is not completely removed. In this way, the target substrate W shaped as depicted in FIG. 29 may be obtained.

After the first etching process, the second etching process may be performed subsequently (FIG. 31(C)). In this case, the bias power may be intermittently supplied to the target substrate W through the supporting table 14 by alternately repeating supply and stop of the bias power. That is, the bias power may be intermittently supplied by alternately repeating bias on (FIG. 31(D)) and bias off (FIG. 31(E)) of AC bias power from the bias power supply unit.

In this case, it is desirable to control the supply of the bias power by adjusting the duty ratio (a/b) of the supply time (a) of the AC bias power to the total time (b) including the supply time (a) and a stop time of the AC bias power to be higher than about 0.18 and lower than about 0.75.

In this way, the second etching process may be performed by alternately repeating bias on and bias off. Then, when the spacer layer 85 may be completely removed from the end region 86c, the second etching process may be ended (FIG. 31(F)).

Thereafter, a protective film, which will be described later, remaining on the spacer layer 85 may be removed and a two-step etching process may be ended.

By performing the spacer etching as described above, it may be possible to perform etching in a desirable shape with more accuracy in a spacer forming process.

A principle of this etching process can be explained by reference to the following case. That is, if the bias power is intermittently supplied, an OFF state of the bias, i.e. a state in which the bias power is not supplied, and an ON state of the bias, i.e. a state in which the bias power is supplied, may be repeated alternately during the plasma etching.

Figure 32:
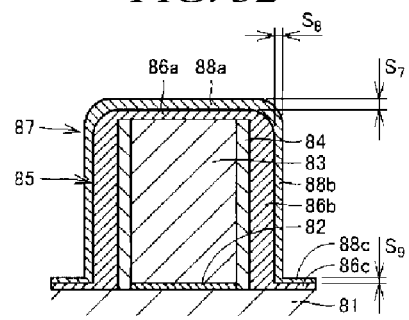
FIG. 32 is a schematic cross sectional view that shows a part of a target substrate when a bias is in an OFF state in a spacer etching process.

FIG. 32 is a schematic cross sectional view that shows a part of a target substrate when a bias is in an OFF state. Referring to FIG. 32, when a bias is in an OFF state, a protective film 87 made of the deposit may be formed on the entire surface of a region on which the spacer layer 85 is formed. This protective film 87 may become thicker as it approaches a region close to plasma in a plasma process, i.e. an upper region shown in FIG. 32. Meanwhile, the protective film 87 may become thinner as it is close to the silicon substrate 81. To be specific, a thickness $s_7$ of the protective film 87 in an upper region 88a on the upper region 86a of the spacer layer 85 or a thickness $s_8$ of the protective film 87 on a side region 88b on a horizontal side of the side region 86b of the spacer layer 85 may become thicker relatively. However, a thickness $s_9$ of the protective film 87 in an end region 88c on the end region 86c of the spacer layer 85 may become thinner relatively.

Figure 33:
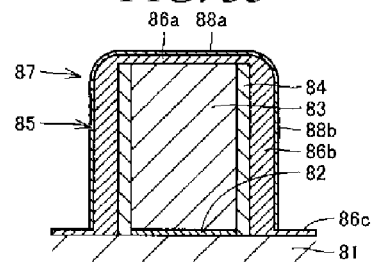
FIG. 33 is a schematic cross sectional view that shows a part of a target substrate when a bias is in an ON state in a spacer etching process.

FIG. 33 is a schematic cross sectional view that shows a part of a target substrate when a bias is in an ON state. Referring to FIG. 33, when a bias is in an ON state, the protective film 87 may be removed by plasma etching. In this case, the thickness $s_7$ of the protective film 87 in the upper region 88a or the thickness $s_8$ of the protective film in the side region 88b may be thicker relatively. Therefore, while the bias is turned on, a process for removing the protective film 87 may be ended when the protective film 87 at the upper region 88a or the side region 88b is removed. Further, the protective film removing process may be ended when the spacer layer 85 on the upper region 86a or the side region 86b may be slightly etched after the protective film 87 at the upper region 88a or the side region 88b is removed. Meanwhile, since the thickness $s_9$ of the protective film 87 on the end region 88c may be thinner relatively, and, thus, while the bias is turned on, the protective film 87 on the end region 88c may be completely removed early and then the exposed end region 86c of the spacer layer 85 may be etched.

At this time, while the protective film 87 on the upper region 88a or the side region 88b is scarcely etched, by turning off the bias, it may be possible to perform etching on the spacer layer 85 on the end region 88c with only scarce etching of the spacer layer 85 on the upper region 86a or the side region 86b. In this way, it may be possible to efficiently etch only the spacer layer 85 at the end region 88c (FIG. 31(F)).

Figure 34:
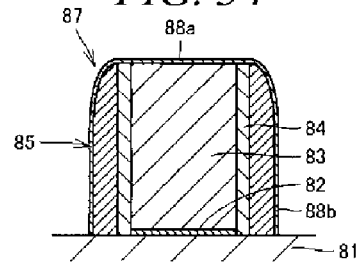
FIG. 34 is a schematic cross sectional view that shows a part of a target substrate when a spacer layer of a side region is removed.
Figure 35:
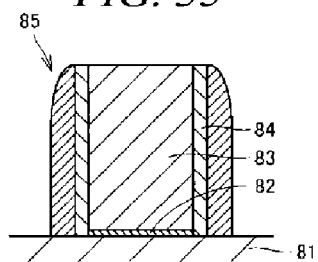
FIG. 35 is a schematic cross sectional view that shows a part of a target substrate when a protective film is removed.

Thereafter, as depicted in FIG. 34, a second etching process may be ended when the spacer layer 85 at the end region 88c is removed. Then, as depicted in FIG. 35, the protective film 87 at the upper region 88a or the side region 88b may be etched so as to form the spacer layer 85 in a desirable shape in which the spacer layer 85 at the side region 86b may become thicker. In this way, spacer etching may be performed.

As described above, it may be possible to form the spacer layer 85 in a desirable shape by preventing the spacer layer 85 formed on the side region 86b during the second etching process from being narrowed by etching.

Figure 36:
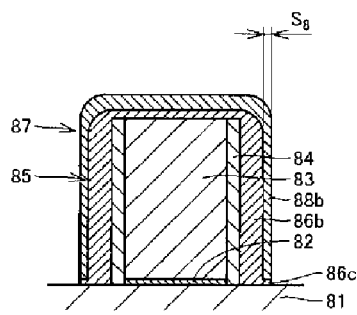
FIG. 36 is a schematic cross sectional view that shows a part of a target substrate when a protective film of a side region becomes thick.
Figure 37:
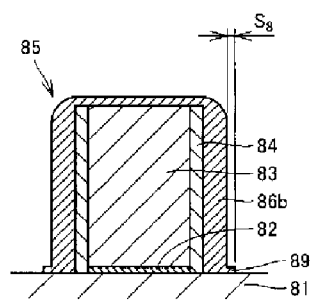
FIG. 37 is a schematic cross sectional view that shows a part of a target substrate when a protective film is removed in case the protective film of a side region becomes thick.

If a frequency of the bias power is low, a thickness of the protective film 87 made of a deposit while the bias is in an ON state may become thicker. In this case, as depicted in FIG. 36, if the thickness $s_8$ of the protective film 87 on the side region 88b formed by bias on and bias off is increased, the spacer layer 85 on the end region 86c may not be completely removed. That is, as depicted in FIG. 37, even if the silicon substrate 81 is exposed by removing the spacer layer 85 on the end region 86c, a spacer layer 89, which is on the end region 86c, of the spacer layer 85 may remain as much as the thickness $s_8$ of the protective film 87 on the side region 88b. In this shape, the spacer layer may have a step-shaped portion on the side region, and, thus, it may not be desirable.

Figure 38:
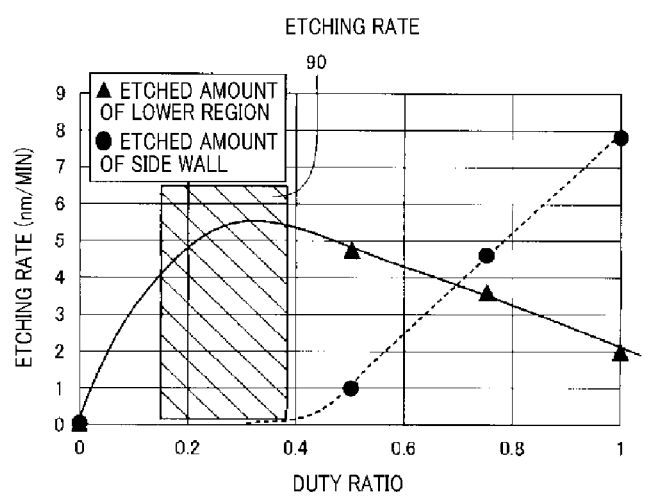
FIG. 38 is a graph showing a relationship between an etching rate and a duty ratio in a bottom wall and a side wall in a spacer etching process.
Figure 39:
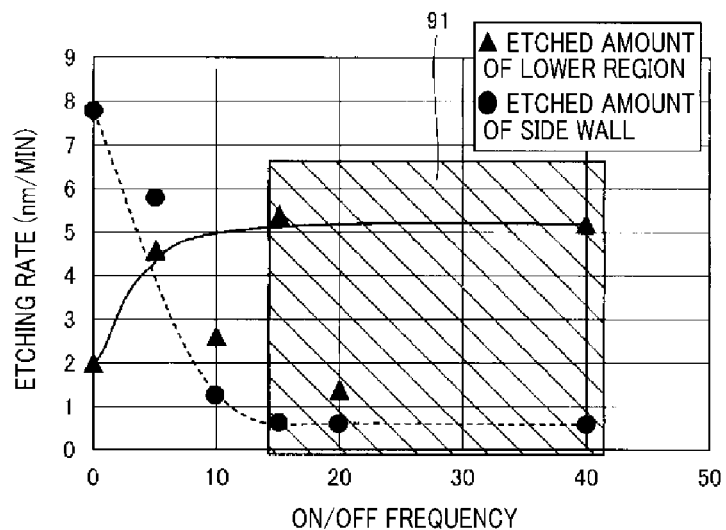
FIG. 39 is a graph showing a relationship between an etching rate and an ON/OFF frequency in a bottom wall and a side wall in a spacer etching process.

FIG. 38 is a graph showing a relationship between an etching rate and a duty ratio in a bottom wall, i.e. the spacer layer on the end region as a top surface of the silicon substrate 81 herein, and a side wall, i.e. the spacer layer on the side region, during the spacer etching. FIG. 38 shows an example in which an ON/OFF frequency may be about 5 Hz. A longitudinal axis may represent an etching rate (nm/min) and a horizontal axis may represent a duty ratio (no unit). FIG. 39 is a graph showing a relationship between an etching rate and an ON/OFF frequency in a bottom wall and a side wall during spacer etching. FIG. 39 shows an example in which a duty ratio is about 0.75. A longitudinal axis may represent an etching rate (nm/min) and a horizontal axis may represent an ON/OFF frequency (Hz).

Referring to FIG. 38, a hatched area 90 of FIG. 38 shows a case where a spacer layer on an end region is etched, but a spacer layer on a side region is not etched. Referring to FIG. 39, a hatched area 91 of FIG. 39 shows a case where a spacer layer on an end region is etched but a spacer layer on a side region is not etched.

Figure 40:
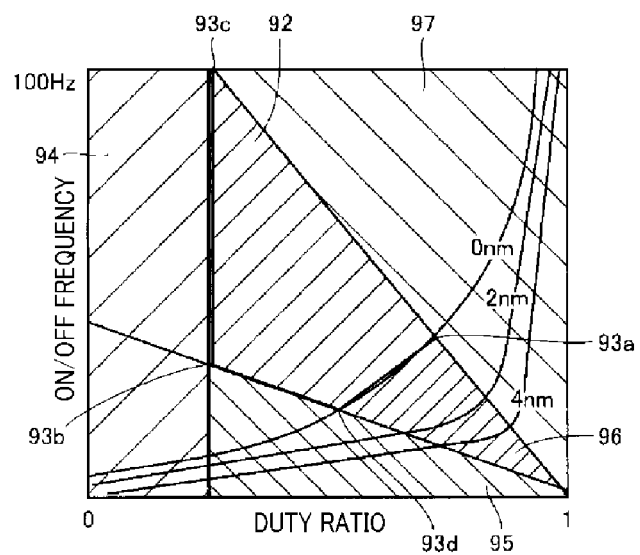
FIG. 40 is a contour view showing a relationship between an ON/OFF frequency and a duty ratio in a spacer etching process.

FIG. 40 is a contour view showing an etching rate in a spacer layer on a side region based on the results of FIGS. 38 and 39. In FIG. 40, a longitudinal axis may represent an intermittent frequency, i.e. a so-called ON/OFF frequency (Hz) and a horizontal axis may represent a duty ratio (no unit).

Referring to FIG. 40, a hatched area 92 may become desirable. In the area 92, a duty ratio at a right end 93a may be about 0.75 and a duty ratio at a left end 93b may be about 0.18. Further, an ON/OFF frequency at an upper end 93c may be about 100 Hz and the ON/OFF frequency at a lower end 93d may be about 5 Hz. In an area 94 on the left of the area 92, a protective film may become too thick at the end region, so that the spacer layer at the end region may be scarcely etched. Further, in an area 95 below the area 92, a protective film may become too thick at the side region, so that a part of the spacer layer on the end region may remain so as to form a step as depicted in FIGS. 36 and 37. In an area 96 at the lower right and an area 97 at the upper right of the area 92, the protective film formed on the side region may become thin and the spacer layer on the side region may be cut and may become narrow.

A frequency at the right end 93a may be about 10 Hz; a frequency at the left end 93b may be about 6 Hz; a duty ratio at the upper end 93c may be about 0.18; and a duty ratio at the lower end 93d may be about 0.5.

Thus, in the relationship between the ON/OFF frequency and the duty ratio during the spacer etching on the side region, it may be desirable to select one of values included in the area 92 of FIG. 40.

In this case, it may be desirable to control the thickness of the protective film formed when the bias is in an OFF state to be about 10 Å or less. In this way, it may be possible to prevent the protective film from becoming excessively thick, and also possible to perform etching in a desirable shape with more accuracy.

In the above-described embodiment, the plasma etching process may be controlled in situ depending on the progress of the process. In this case, the progress of the plasma etching process may be measured, by way of example, by a measurement apparatus capable of measuring a plasma status with an emission monitor, a film thickness measurement apparatus capable of measuring a film thickness of a target substrate with a film thickness monitor or a measurement apparatus capable of measuring a line width (CD: Critical Dimension) with scaterometry. Based on the measured data, the ON/OFF frequency and/or the duty ratio may be changed appropriately during the plasma etching process in order to obtain a desirable shape. Further, a plasma etching profile may be adjusted by changing a supply amount of a gas used for modification of a protective film. A parameter changed during the plasma etching process can be obtained from the contour view or graph shown in FIGS. 12, 13, 38, 39, and 40.

Further, when a target substrate is taken out of the plasma etching apparatus after the plasma etching process is performed, the shape may be measured by the measurement apparatus and the ON/OFF frequency and/or the duty ratio may be changed such that a following target substrate to be processed subsequently may have a desirable etching profile. That is, feedback control may be carried out. Furthermore, an etching profile may be adjusted by changing the supply amount of the gas used for modification of the protective film.

Further, a shape of an etching mask on the target substrate may be measured by using the measurement apparatus and the ON/OFF frequency and/or the duty ratio may be changed such that the target substrate may have a desirable etching profile. That is, feed-forward control may be carried out. Furthermore, the etching profile may be adjusted by changing the supply amount of the gas used for modification of the protective film.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

What is claimed is:

1. A plasma etching method for performing an etching process on a target substrate with generated plasma by using a plasma etching apparatus including a processing chamber configured to perform therein a plasma process on the target substrate; a gas supply unit configured to supply a plasma processing gas into the processing chamber; a supporting table positioned within the processing chamber and configured to support the target substrate thereon; a microwave generator configured to generate a microwave for plasma excitation; a plasma generation unit configured to generate plasma within the processing chamber by using the microwave generated by the microwave generator; and a pressure control unit configured to control a pressure within the processing chamber, the plasma etching method comprising:

forming a gate insulating film layer, a gate electrode layer and a gate side wall on a silicon substrate, forming a spacer layer to cover the gate insulating film layer, the gate electrode layer and the gate side wall, the spacer layer including an upper region formed on the gate electrode layer, a side region formed on a side surface of the gate side wall, and an end region formed on a horizontal side of the side region on the silicon substrate, performing a first etching process on the spacer layer until just before the spacer layer on the end region is completely removed, and performing a second etching process on the spacer layer so that the spacer layer is completely removed from the end region, wherein in the second etching process, an AC bias power is controlled by alternately repeating supply and stop of the AC bias power, a protective film is formed on the spacer layer when the AC bias power is in an OFF state, a thickness of the protective film is about 100 Å or less, a duty ratio (a/b) of a supply time (a) of the AC bias power to a total time (b) of the AC bias power in the second etching process is in a range of from about 0.18 to about 0.75, and an ON/OFF frequency of the AC bias power in the second etching process is in a range of from about 5 Hz to about 100 Hz.

2. The plasma etching method of claim 1, wherein a duty ratio (a/b) of a supply time (a) of the AC bias power to a total time (b) of the AC bias power is about 0.75.

3. A method for manufacturing a semiconductor device by performing an etching process by using a silicon nitride mask formed on a silicon substrate supported on a supporting table, the method comprising:

forming a gate insulating film layer, a gate electrode layer and a gate side wall on a silicon substrate, forming a spacer layer to cover the gate insulating film layer, the gate electrode layer and the gate side wall, the spacer layer including an upper region formed on the gate electrode layer, a side region formed on a side surface of the gate side wall, and an end region formed on a horizontal side of the side region on the silicon substrate, supplying a plasma processing gas with a ratio of a gas containing oxygen atoms to the whole plasma processing gas in a range of from about 0.05% to about 5% when etching the silicon substrate;

performing a first etching process on the spacer layer until just before the spacer layer on the end region is completely removed;

performing a second etching process on the spacer layer so that the spacer layer is completely removed from the end region; and controlling an AC bias power supplied to the supporting table by adjusting a duty ratio (a/b) of a supply time (a) of the AC bias power from a bias power supply unit to a total time (b) including the supply time (a) and a stop time of the AC bias power to be in a range of from about 0.18 to about 0.75, wherein in the second etching process, an AC bias power is controlled by alternately repeating supply and stop of the AC bias power, a protective film is formed on the spacer layer when the AC bias power is in an OFF state, a thickness of the protective film is about 100 Å or less, and an ON/OFF frequency of the AC bias power in the second etching process is in a range of from about 5 Hz to about 100 Hz.

4. The method for manufacturing a semiconductor device of claim 3, wherein the duty ratio is about 0.75.

5. A plasma etching method for performing a plasma etching process on a target substrate supported on a supporting table, the method comprising:

forming a gate insulating film layer, a gate electrode layer and a gate side wall on a silicon substrate, forming a spacer layer to cover the gate insulating film layer, the gate electrode layer and the gate side wall, the spacer layer including an upper region formed on the gate electrode layer, a side region formed on a side surface of the gate side wall, and an end region formed on a horizontal side of the side region on the silicon substrate, generating plasma by supplying into a processing chamber an etching gas and a gas capable of oxidizing and modifying a reaction by-product with radicals;

performing a first etching process on the spacer layer until just before the spacer layer on the end region is completely removed;

performing a second etching process on the spacer layer so that the spacer layer is completely removed from the end region;

oxidizing and modifying a deposited reaction by-product with radicals; and controlling a deposit amount of the reaction by-product by adjusting a duty ratio (a/b) of a supply time (a) of an AC bias power to a total time (b) of the AC bias power and by adjusting an ON/OFF frequency of the bias power, wherein in the second etching process, an AC bias power is controlled by alternately repeating supply and stop of the AC bias power, a protective film is formed on the spacer layer when the AC bias power is in an OFF state, a thickness of the protective film is about 100 Å or less, the duty ratio (a/b) in the second etching process is in a range of from about 0.18 to about 0.75, the AC bias power is supplied to the supporting table for supporting the target substrate, and the total time (b) includes the supply time (a) and a stop time of the AC bias power, and the ON/OFF frequency of the AC bias power is in a range of from about 5 Hz to about 100 Hz.

6. The plasma etching method of claim 5, wherein the duty ratio is about 0.75.

* * * * *

UNITED STATES PATENT AND TRADEMARK OFFICE
CERTIFICATE OF CORRECTION

PATENT NO. : 8,969,210 B2  
APPLICATION NO. : 13/232160  
DATED : March 3, 2015  
INVENTOR(S) : Toshihisa Nozawa et al.

It is certified that error appears in the above-identified patent and that said Letters Patent is hereby corrected as shown below:

In the Specification,

Column 6, lines 58-59, please add -- 37 -- between "central conductor" and "and outer"

Column 16, line 33, please replace "$s_6$" with -- $s_5$ --

Column 18, line 32, please add -- 87 -- between "film" and "in"

Signed and Sealed this  
Fourteenth Day of July, 2015

Michelle K. Lee  
*Director of the United States Patent and Trademark Office*